United States Patent [19]

Baües

[11] Patent Number: 4,525,874

[45] Date of Patent: Jun. 25, 1985

[54] DEVICE FOR TRANSMITTING MEASURED VALUES TO A REMOTE LOCATION

[75] Inventor: Peter Baües, Krailling, Fed. Rep. of Germany

[73] Assignee: Siemens Aktiengesellschaft, Berlin and Munich, Fed. Rep. of Germany

[21] Appl. No.: 409,156

[22] Filed: Aug. 18, 1982

[30] Foreign Application Priority Data

Sep. 24, 1981 [DE] Fed. Rep. of Germany ........ 3138074

[51] Int. Cl.³ .................................................. H04B 9/00
[52] U.S. Cl. ..................................... 455/600; 455/612
[58] Field of Search ............... 455/600, 606, 608, 612, 455/609

[56] References Cited

U.S. PATENT DOCUMENTS

| | | | |
|---|---|---|---|
| 4,316,141 | 2/1982 | Adolfsson et al. | 324/96 |
| 4,326,298 | 4/1982 | Fromm et al. | 455/606 |
| 4,346,478 | 8/1982 | Sichling | 455/612 |

FOREIGN PATENT DOCUMENTS

| | | | |
|---|---|---|---|
| 56-36245 | 4/1981 | Japan | 455/612 |
| 56-36243 | 4/1981 | Japan | 455/612 |

OTHER PUBLICATIONS

Robertson, "Power Transfer Via Fiber Optics", *Proceedings of the 30th Electronics Components Conference*, San Francisco, U.S.A., Apr. 28-30, 1980, pp. 216-221.
Nelson et al., "Modulators for Multimode Single Fiber Communications Systems", *Proceedings of the Technical Program, Electro-Optical Systems Design Conference*, New York, N.Y., Sep. 14-16, 1976, pp. 36-39.
Auracher et al., "New Electro-Optic Bragg Deflectors with Low Insertion Loss and Multiple-Beam Capability", *Siemens Forsch. -u Entwickl.-Ber.*, vol. 10, (1981), No. 1, pp. 44-47.
Baues, "Integriert Optische Richtkoppler", *Elektronic-Anzeiger*, vol. 9 (1977), No. 3, pp. 19-22.
Somekh et al., "Channel Optical Waveguide Directional Couplers", *Applied Physics Letter*, vol. 22, No. 2, Jan. 1973, pp. 46-47.
Papuchon et al, "Electrically Switched Optical Directional Coupler: Cobra", *Applied Physics Letter*, vol. 27, No. 5, Sep. 1, 1975, pp. 289-291.
Schmidt et al., "Electro-Optically Switched Coupler with Stepped $\Delta\beta$-Reversal Using Ti-Diffused LiNbO₃ Waveguides", *Applied Physics Letter*, vol. 28, No. 1, May 1, 1976, pp. 503-506.
Kogelnick et al., "Switched Directional Couplers with Alternating $\Delta\beta$", *IEEE Journal of Quantum Electronics*, vol. OE-12, No. 7, Jul. 1976, pp. 396-401.
Sasaki et al., "Electro-Optic Y-Junction Modulator/-Switch", *Electronics Letters*, vol. 12, No. 18, Sep. 2, 1976, pp. 459-460.
Keil et al., "Mach-Zehner Waveguide Modulators in Ti-Diffused LiNbO₃", *Siemens Forsch. -u. Entwickl.-Ber.*, vol. 9, No. 1, 1980, pp. 26-31.
Kaminow, "Optical Waveguide Modulators", *IEEE Transactions on Microwave Theory and Technique*, vol. MTT-23, No. 1, Jan. 1975, pp. 57-70.
Brosio et al., "A Low Consumption, Light Powered Telephone on Optical Fibre", *Sixth European Conference on Optical Communication*, University of York, United Kingdom, Sep. 16-19, 1980, pp. 242-245.

(List continued on next page.)

*Primary Examiner*—Robert L. Griffin
*Assistant Examiner*—Timothy K. Greer
*Attorney, Agent, or Firm*—Hill, Van Santen, Steadman & Simpson

[57] ABSTRACT

A device for transmitting measured values to a remote location characterized by the sensor device applying an output voltage control to an electro-optical modulator to create a light signal from a source of light received from a remote location for conducting back to the remote location and the energy for the sensor device being supplied as light energy from a remote location which is converted into electrical energy by a transducer associated with the sensor device.

23 Claims, 1 Drawing Figure

OTHER PUBLICATIONS

Panish, "Heterostructure Injection Lasers", *IEEE Transaction on Microwave Theory and Techniques*, vol. MTT-23, No. 1, Jan. 1975, pp. 20-30.

Lebailly, "Situation des Diodes Électroluminescentes pour Liaisons par Fibres Optiques", *Acta Electronica*, vol. 22, (1979), No. 4, pp. 301-310.

Heinlein et al., "Digitale Übertragung über optische Wellenleiter im Wellenlängenbereich Oberhalf 1 µm", *Frequenz*, vol. 32 (1978), No. 3, pp. 79-84.

Melchior, "Sensitive High Speed Photodetectors for the Demodulation of Visible and Near Infrared Light", *Journal of Luminescence*, vol. 7, (1973), pp. 390-414.

Ando et al, "Characteristics of Germanium Avalanche Photodiodes in the Wavelength Region of 1-1.6 µm", *IEEE Journal of Quantum Electronics*, vol. QE-14, 1978, No. 11, pp. 804-809.

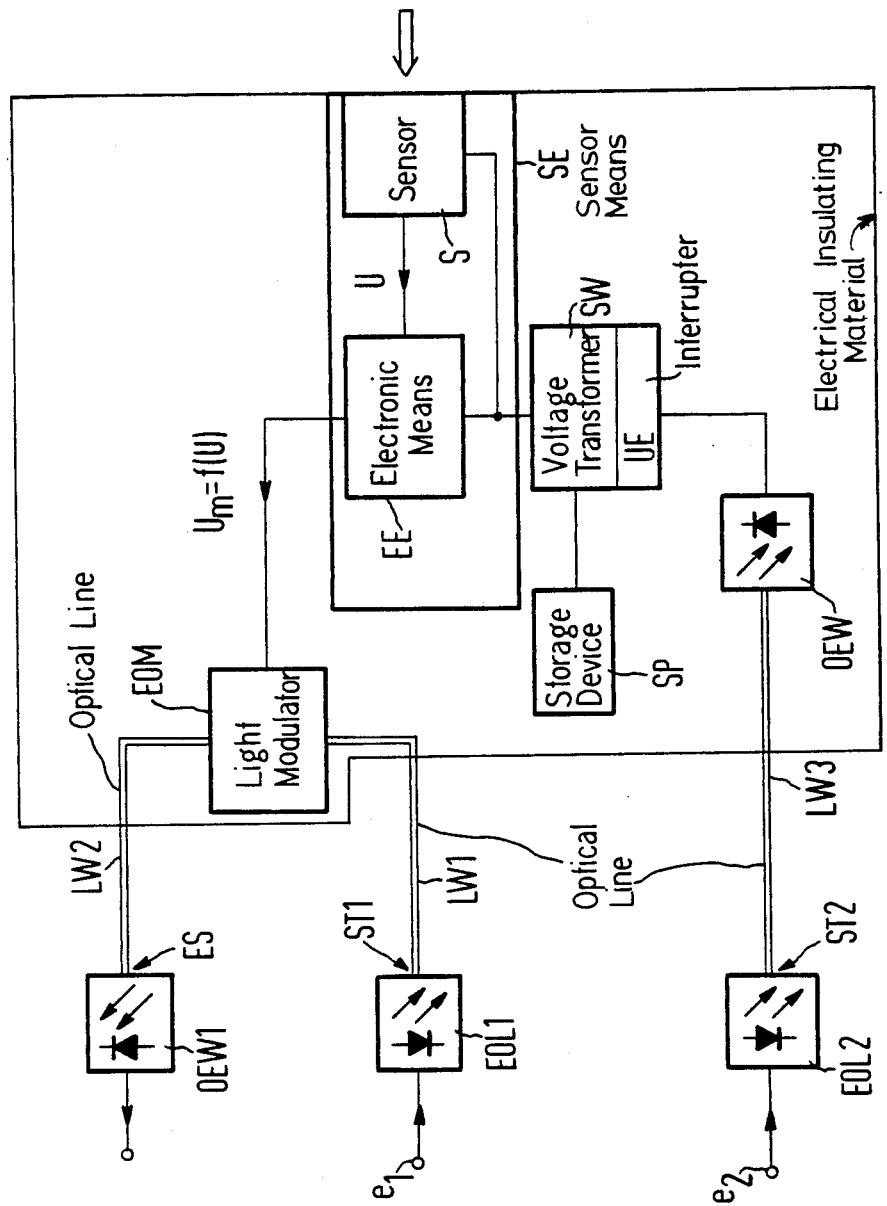

DEVICE FOR TRANSMITTING MEASURED VALUES TO A REMOTE LOCATION

BACKGROUND OF THE INVENTION

The present invention is directed to a device having an arrangement for measuring or sensing a value of a measured condition at a test location and having an arrangement for transmitting the measure values to a remote location.

When transmitting a measured value, which is in the form of electrical signals, from the measured location to a remote location, various problems occur. Examples of these problems are that the electrical signals when transmitted, in particular, over electrical lines are sensitive to electro-magnetic radio interference and the employment of the electrical lines sometimes create problems because of safety reasons. For example the electrical signal can be influenced or distorted when transmitted through an area in which a high electrical potential difference occurs. In addition, the electrical signals being transmitted over the electrical line can create a danger of an explosion in certain areas. When a significant value is placed on a high operating safety, these above mentioned problems become of particular importance in industrial measurement techniques.

These above noted reasons speak in favor of attempting to modify the sensor technology by transmitting the measured values over optical lines particularly over light waveguides with the values being in the form of optical signals. Optical lines are insensitive to electro-magnetic radio interference and they are particularly employable given a high electrical potential differences and in areas subject to the danger of explosion. Added thereto are the light weight, small dimensions and high flexiblity of the light waveguides as well as their resistance to most agressive chemical substances. The properties of light waveguides thus are considerably significant in the practical areas.

Another advantage of the use of light waveguides is that given the presently standard impressed 20 mA signal for the measured value transmission, high voltage levels, which have a negative effect on the power pact cost because of high power requirements, are required. In addition, after traveling in line lenghts of approximatly 500 meters because of the significant line resistance, further processing of the signal will be required. In comparison thereto, light waveguides can bridge great distances because of the low attenuation from approximatly 1 dB/km through 5 dB/km.

However, problems do occur because many sensors or sensing means are active and therefore require an externally supplied electrical power for their operation. Beyond that, the amplitude as well as the chronological progression of the measured-value dependent electrical signal, for example the voltage is unsuitable for direct conversion into an optical signal in a number of sensors. Therefore, a pre-processing of the electrical signal emitted by the sensor is necessary and power must also be made available for this purpose.

SUMMARY OF THE INVENTION

An object of the present invention is to create a device which enables transmitting measured values to a remote location which device makes it possible in combination with an optical measured value transmission to transmit the required electrical power as light power and which device thereby retains the advantage of the optical signal transmission.

To accomplish these objects, the present invention is directed to an improvement in a device for transmitting measured values of a measured condition from a test location to a remote location, said device comprising sensor means for testing a condition to be measured and for creating electrical output signals dependent on the value of the condition and means for transmitting or communicating the output signal to a remote location. The improvements includes the means for communicating being modulator means being disposed adjacent the sensor means for receiving the electrical output signal and modulating light into a light signal in response to the electrical output signal, a first source of light positioned remote to the sensor means, a first optical line for conducting light from said first source to the modulator means, a second optical line for conducting the modulated light signal from the modulator means to a point removed from the test location and means for supplying electrical energy to the sensor means, which includes a second light source positioned at a point remote from the test location, transducer means for converting optical power into an electrical power being arranged adjacant the sensor means and a third optical line waveguide extending between the second source and said transducer means.

Among other things, the device of the present invention can be utilized in industrial quality and process control. In addition, the device of the present invention has utility in military technology, for example in view of vehicles and missiles, and also in traffic engineering, for example in the control of motors.

Preferably, the optical lines consist of at least one light waveguide and the third optical line preferably comprises a plurality of light wavguides. Each of the waveguides is preferably a thick core fiber.

To obtain the desired amount of voltage for the sensor means, the transducer means may comprise either an opto-electrical transducer connected to a voltage transformer, a plurality of opto-electrical transducers connected in series or a plurality of opto-electrical transducers connected in series with their output to a voltage transformer. When utilizing a voltage transformer, an electrical storage device is preferably connected to the voltage transformer and the storage device may be a rechargeable storage device such as a battery or may be a capacitor. The means for supplying electrical power may also include controllable interrupt means, such as a bistable flip-flop, which is positioned adjacent the sensor means and coupled to the opto-electrical transducer to selectively interrupt or switch off the power to the sensor means in response to a control signal. With such an interrupt means, charging means are provided for charging the storage device during that period of time when the interrupt means has switched-off the power to the sensor means.

The sensor means includes at least one sensor element which will generate an electrical signal that is dependent on the sampled or tested value and the sensor means includes electronic means which converts the electrical signal of the sensor element into an electrical signal dependent thereon, which is suitable to drive the modulator means. If the output signal of the electronic means is an alternating voltage, its frequency is modulated by the electrical signal from the sensor element. If the output signal is a pulse sequence, then the signal from the sensor element will modulate the pulse phase and/or the pulse length of the signal. The signal from the sensor element can also be utilized to create an output signal from the electronic means which is a binary coded signal that represents the signal from the sensing element.

Preferably, the electronic means is formed as a low loss integrated complementary metal-oxide semiconductor device known as a CMOS or a current injected logic which is known as a I²L semiconductor circuit. In addition to the electronic means, the voltage transformer can also be formed of such low loss circuits.

The light source, which is coupled to the first optical line, or the light source which is conducted to the third optical line may be opto-electronic transducers such as a laser, or a light emitting diode. The second light source can also be a xenon arc lamp. These light sources can provide a steady output or a pulse output which has a regular pulse sequence.

The second light waveguide may be conducted to an opto-electronic transducer such as a photodiode or an avalanche photodiode with a following amplifier.

The electro-optical modulator can consist of a mono-mode waveguide modulator or a multimode modulator. The multimode modulator may be a Bragg modulator.

BRIEF DESCRIPTION OF THE DRAWING

The FIGURE is a block diagram of the device of the present invention.

DESCRIPTION OF THE PREFERRED EMBODIMENTS

The principles of the present invention are particularly useful in a device which is illustrated in a block diagram in the FIGURE. The device of the present invention includes sensor means SE which are disposed at the test location and generate an electrical voltage $U_m$ which will depend on the sampled or tested values for the measured quantity or condition. This voltage $U_m$ is supplied as a control signal to modulator means or a light modulator EOM which is also disposed at the test location in a closed position or adjacent to the sensor means SE. Light is supplied to the light modulator EOM over a first optical line LW1 from a location ST1 which is remote from the test location and the sensor means SE. The light being modulated in the light modulator EOM by the voltage $U_m$ is then conducted as a modulated light signal on a second optical line LW2 to an output location ES which is remote or removed from the test location and can be utilized at this location ES for purposes of further employment or processing.

To supply electrical energy to the sensor means SE, means for supplying electrical energy from a remote location ST2 which may be similar to the remote location ST1 or to the location ES is provided. This means for supplying electrical power includes a third optical line LW3, which is connected from a light source to transducer means OEW which is positioned close to the sensor means SE. The transducer means OEW can be one or more photocells which will convert the light into an electrical power, which is required for operation of the electrical part of the power consuming sensor means SE. It should be noted, that an arrangement for power transmission over glass fibers is known per se and an example is disclosed in the article by M. M. Robertson, "Power Transfer Via Fiber Optics", *Proceedings of the 30th Electronic Components Conference*, San Francisco, Calif., U.S.A., Apr. 28-30, 1980, pages 216–221.

However, the voltage emitted by the photocell is too small for a direct operation of a power consuming component such as for example a semiconductor components. A voltage boost can be achieved by the following three arrangements. The light provided to the transformer means can be supplied to a plurality of photo electric cells which are connected in series to each other; or the light can be supplied to either a single photo electric element whose output is connected in a voltage transformer SW or a plurality of photo electric elements which are connected in series with their output being directed to the voltage transformer SW which may be a transverter or a commentator transformer and is preferably used in conjunction with a storage device SP for electrical energy.

The voltage transformer SW and the storage device SP can be assigned to the electrical part of the sensor means SE. Preferably, the sensor means SE also has a sensor S, which is composed of one or more elements, which generate a voltage U dependent on the sampled or measured values. The sensor means SE also contains an electronic means EE, which converts the voltage U generated by the sensor S into the voltage $U_m = F(U)$ that is dependent on the voltage U and which is suitable for the light modulator EOM. This voltage $U_m$ can be an alternating voltage whose frequency is controlled or modulated such as by a frequency modulation by the voltage U generated by the sensor S. Finally, it can also be a pulse sequence in which the pulse phase or the pulse length is modulated by the voltage U. However, the electronic means EE can also generate a binary coded signal which represents the voltage U from the senor S.

Preferably, a controllable interrupt means UE is coupled between the photocell and is disposed close to the sensor means SE. Thus, the power supply for the sensor means SE will be selectively interrupted or connected by the interrupt means UE by means of a control signal which can be supplied over the third optical line LW3. The interrupt means UE or interrupter can be formed by a bistable flip flop and under certain conditions it can be built directly into the voltage transformer SW.

Thus with the assistance of the corresponding interrupt means UE, the storage device SP can be charged with electrical energy. This will occur during a time span in which the power or current supply to the sensor means SE for the transducer OEW is interrupted. The storage device SP is preferably a rechargeable storage device and can be a storage battery for example a nickel cadium cell known as a NC cell or it can also be a capacitor.

The output voltage $U_m$ from an electronic means EE is supplied to the light modulator EOM which controls the light passage in accordance with the voltage $U_m$. If viewed electrically, the light modulator acts as a small capacitor and can be a known multi-mode modulator, a Bragg modulator or a mono-mode waveguide modulator. An example of a multi-mode modulator is disclosed by an article by A. R. Nelsen et al, "Modulators for Multimode Single Fiber Communications Systems", *Proceedings of the Technical Program, Electro-Optical Systems Design Conference*, N.Y., Sept. 14–16, 1976, pages 36–39. An example of a Bragg modulator is disclosed in an article by F. Auracher et al, "New Electro-Optic Bragg Deflectors With Low Insertion Loss and Multiple-Beam Capability", *Siemens Forsch. -u Entwickl.-Ber.*, Vol. 10, (1981) No. 1, pages 44–47. Mono-mode light waveguide modulators are classified into three different groups. The first group is directional coupler modulators which are discussed by P. Baues, "Integriert optische Richtkoppler", *Elektronik-Anzeiger*, Vol. 9 (1977), No. 3, pages 19-22. The first group has two sub-groups with one sub-group being directional modulators with electrodes that are continuous for the full coupling length which are disclosed by S. Somekh et al, "Channel optical waveguide directional couplers", *Applied Physics Letter*, Vol. 22 (1973), pages 46-47 and by M. Papuchon et al, "Electrically switched optical directional coupler: Cobra", *Applied Physics Letter*, Vol. 27 (1975), pages 289-291. The other sub-group is directional coupler modulators with divided or split electrodes on the coupling length which are disclosed by R. V. Schmidt et al, "Electro-optically switched coupler with stepped $\Delta\beta$-reversal using Ti-diffused LiNbO$_3$ waveguides", *Applied Physics Letter*, Vol. 28 (1976), pages 503-506 and by H. Kogelnik et al, "Switched directional couplers with alternating $\Delta\beta$", *IEEE Journal of Quantum Electronics*, Vol. OE-12, No. 7, July 1976, pages 396-401. The second group of mono-mode modulators are controllable y-junction modulators which are disclosed by H. Sasaki et al, "Electro-optic Y-junction modulator/switch", *Electronics Letters*, Vol. 12, September 1976, pages 459-460. The third group of mono-mode modulators is Mach-Zehner modulators which have a sub-group with Y-junction which are disclosed by R. Keil et al, "Mach-Zehner Waveguide modulators in Ti-diffused LiNbO$_3$", *Siemens Forsch. -u. Entwickl-Ber.*, Vol. 9, No. 1, 1980, pages 26-31 and a second sub-group with 3-dB couplers which are disclosed by J. P. Kaminow, "Optical Waveguide Modulators", *IEEE Transactions on Microwave Theory and Technique*, Vol. MTT-23, No. 1, January 1975, pages 57-70.

For obtaining one of the above described modulation methods, the electronic means EE or electronic part of the sensor means SE preferably consists of a low-loss, integrated complementary metal-oxide-semiconductor device, which is called a CMOS device or a current injected logic semiconductor circuit which is called I$^2$L semiconductor circuit. These circuits are known in semiconductor technology and can be constructed without difficulties. Voltage transformers are mentioned in the above mentioned article by M. M. Robinson and also by A. Brosio et al, "A Low Consumption, Light Powered Telephone on Optical Fibre", *Sixth European Conference on Optical Communication*, York, United Kingdom, Sept. 16-19, 1980, pages 242-245.

The optical line formed by the light waveguide LW1 which extends to a remote location ST1 is preferably connected to a source of light such as an electro-optical power conversion unit EOL1 that couples light into the waveguide. The unit EOL1 receives an electrical input e$_1$ and converts this electrical power into light power. In a similar manner, the optical line LW3 which is formed by a single or a bundle of light waveguides extends to the remote station ST2 and is coupled to a unit EOL2 which is also an electro-optical power conversion unit that receives electrical energy e$_2$. The light, which is to be modulated, is produced by the unit EOL1 while the light from the source EOL2 is the light source which is converted into electrical energy at the transducer means OEW. Both of these light sources can produce a steady radiation or pulse radiation which is modulated in the form of regular pulse sequences. When the light is modulated in pulse sequences, the line length between the test location where the sensor means SE is located and the two locations such as ST1 and ST2 for example, which may be in the central station can be increased as a result of a high pulse power peak which are now possible. Another advantage is that for the semiconductor technology the voltage transformer receives an alternating current emitted by the photocell which current was created from the pulse sequences.

The units or means EOL1 and EOL2 for the electro-optical power conversion can be light transmitters of various types. All types of lasers including semiconductor lasers or solid state lasers, gas lasers can be utilized. Light emitting diodes can also be used. Various materials are employed for the manufacture of the semiconductor lasers and for light emitting diodes which materials depend on the light wavelength desired. Examples of materials used for semiconductor lasers are disclosed by M. B. Panish, "Heterostructure Injection Lasers", *IEEE Transaction on Microwave Theory and Techniques*, Vol. MTT-23, pages 20-30. Examples of light emitting diode materials are disclosed by J. Lebailly, "Situation des diodes électroluminescentes pour liaisons par fibres optiques", *Acta Electronica*, Vol. 22 (1979), No. 4, pages 301-310. The semiconductors may be ternary semiconductors such as (GaAl)As or (InGa)As or may be quarternary semiconductors such as (GaIn)(AsP) which are disclosed by W. Heinlein et al, "Digitale Übertragung über optische Wellenleiter im Wellenlängenbereich Oberhalb 1 $\mu$m", *Frequenz*, Vol. 32, (1978), No. 3, pages 79-84. Binary semiconductors such as GaP also come into consideration for light emitting diodes. The gas lasers can be He-Ne lasers. For the unit EOL2 which serves for power transmission or transfer, a xenon arc lamp can also be utilized as the light source.

A photodiode or avalanche photodiode OEW1 with a preferably following amplification is expediently provided at the output location ES which for example can lie at the central station. The photodiode or avalanche photodiode reconverts the modulator light signal conducted to the output location ES into electrical signals. Photodiodes usually consist of silicon as disclosed by H. Melchior, "Sensitive High Speed Photodetectors for the Demodulation of Visible and Near Infrared Light", *J. Luminescence*, Vol. 7 (1973), pages 390-414, but germanium photo diodes also come into consideration for longer wavelengths of the light as disclosed in H. Ando et al, "Characteristics of Germanium Avalanche Photodiodes in the Wavelength Region of 1-1.6 $\mu$m", *IEEE Journal of Quantum Electronics*, Vol. QE-14, 1978, No11, pages 804-809. As in the case of laser diodes and light-emitting diodes, the photo diodes can also be manufactured of ternary or quarternary semiconductors.

The photocell is a special photodiode for the conversion of optical energy into electrical energy. Depending upon the wavelength of the light being received, it is manufactured of the same materials as the photodiode.

The light waveguides can be optical fibers having a stepped index of refraction, they can be optical fibers with a gradient index of refraction or they can be mono-mode waveguides. Preferably, thick core fibers with a particularly large core cross section come into consideration.

The power or current supply for the sensor element is optional. There are sensor elements, which obtain enough power from the measured condition or quantity that a voltage is produced which is sufficient for driving the electronic means EE. Such sensors, for example are piezoelectric transducers, thermo-elements, Hall-effect transducers, etc. However, other sensor elements require a power supply for generating the voltage U. These types of sensors include, for example, foil strain gauges, for example in the form of bridge circuits, capacitive pressure pick-ups, etc.

The power consuming sensor means SE and if need, the electronic means EE and the parts, which are electrically coupled thereto for example the electro-optical transducer OEW, the voltage transformer SW, the interrupt means UE, if present, the storage means SP for electrical energy, if present, and the electro-optical modulator EOM, are expediently combined to form a structural unit or means. It is particularly expedient to completely embed or encapsulate this group of parts in an electrically insulating material, for example PVC, in such a manner that only the sensor elements sampling the measured quantity remains accessible from the outside of the structural unit or means. This construction is recommendable for employment in areas in which danger of explosion and/or high electrical potential differences prevail. A very high safety factor can therefore be achieved in a relatively cheap manner.

In general, the proposed arrangement device is excellently suited for potential separation.

The storage unit SP chargeable by means of the optically supplied energy enables very large distances to be bridged.

The term such as "remote" and "close" or adjacent as used hereinabove are quantitatively understood. A location remote from the sensor means SE is farther removed therefrom than a location situated close to the sensor means or adjacent to the sensor means. In practice, a remote location or location far removed from the sensor means SE will frequently be distances from the sensor means in the range of 1 meter or more whereas a part lying close to or adjacent the sensor means will be a distance from the sensor element in a range of 1 cm and below and even closer in the case of an integrated circuit.

Although various minor modifications may be suggested by those versed in the art, it should be understood that I wish to embody within the scope of the patent granted hereon, all such modifications as reasonably and properly come within the scope of my contribution to the art.

I claim:

1. In a device for transmitting measured values of a measured condition from a test location to a remote location, said device comprising sensor means for testing a condition to be measured and creating an electrical output signal dependent on the value of the condition, said sensor means requiring electrical energy for operation and including electrical parts and at least one sensor element for creating an electrical signal which is dependent on the measured values, and means for communicating the electrical output signal to a remote location, the improvements comprising the means for communicating including a modulator means being disposed adjacent the sensor means for receiving the electrical output signal of the sensor means and modulating light into a light signal in response to the electrical output signal, a first source of light positioned at the remote location, a first optical line for conveying light from said first source to the modulator means, a second optical line for conveying the light signal from the modulator means back to a location remote from the sensor means, said sensor means including electronic means for converting the electrical signal of the sensor element into an electrical output signal for operating the modulator means by creating an output voltage of an alternating voltage whose frequency is modulated by the electrical signal of the sensor element; said device including means for supplying electrical energy to the sensor means including a second light source at a position remote to the sensor means, a voltage transformer, an electrical rechargeable storage device being connected to the voltage transformer, transducer means being disposed adjacent the sensor means and being connected to the sensor means through the voltage transformer for converting light into electrical energy for operation of the electrical parts of the sensor means, and a third optical line extending from said light source to the transducer means; and said device including structural means to encapsulate the modulator means, the voltage transformer, the storage device, the transducer means and the sensor means in an electrical insulating material with only the sensor element being accessible from the exterior of the structural means.

2. In a device according to claim 1, wherein each of the optical lines consist of at least one light waveguide.

3. In a device according to claim 2, wherein the third optical line comprises a plurality of light waveguides.

4. In a device according to claim 3, wherein each of the light waveguides of the first and second optical lines and each of the plurality of light wavesguides of the third optical line consists of a thick core fiber.

5. In a device according to claim 2, wherein each of the light waveguides of the optical lines comprises a thick core fiber.

6. In a device according to claim 1, wherein the transducer means includes a plurality of opto-electrical transducers connected in series for receiving the light.

7. In a device according to claim 1, wherein the rechargeable storage device consists of a storage battery.

8. In a device according to claim 1, wherein the rechargeable storage device is a capacitor.

9. In a device according to claim 1, wherein the electrical output signal of the electronic means is a pulse sequence having pulse phase and length modulated by the electrical signal from the sensor element.

10. In a device according to claim 1, wherein the electronic means produces a binary coded signal for application to the modulator means, said code representing the electrical signal from the sensor element.

11. In a device according to claim 1, wherein the electronic means comprises a low-loss integrated CMOS.

12. In a device according to claim 1, wherein the electronic means comprises a low-loss current injected logic semiconductor circuit.

13. In a device according to claim 1, which includes controllable interrupt means being disposed adjacent the sensor means in the structural means and coupled to the transducer means, said interrupt means selectively interrupting the power supply being applied to the sensor means in response to the control signals supplied on the third optical line.

14. In a device according to claim 13, wherein the interrupt means includes a bistable flip flop.

15. In a device according to claim 13, wherein said storage device is charged during a time span in which the interrupt means has discontinued application of the electrical power to the sensor means.

16. In a device according to claim 1, wherein the first light source is an electro-optical power transducer having an optical power output being coupled into the first optical line and the second light source is an electro-optical power transducer having an optical output power being coupled into the third optical line and which device includes an opto-electronic transducer being provided at the remote location and connected to the output of the second optical transmission line so that the optical signal is converted into an electrical signal for further processing.

17. In a device according to claim 16, wherein the electro-optical power transducer forming the first light source is selected from a group consisting of lasers and light emitting diodes and wherein the electro-optical transducer comprising the second light source is selected from a group consisting of lasers, light emitting diodes and xenon arc lamps.

18. In a device according to claim 16, wherein at least one of the electro-optical power transducers which form a light source emits steady radiation.

19. In a device according to claim 16, wherein at least one of the electro-optical transducers which form a light source emits a pulse radiation with a regular pulse sequence.

20. In a device according to claim 16, wherein the opto-electronic transducer connected to the second optical line is selected from a group consisting of photodiodes and avalanche photodiodes with following amplifier.

21. In a device according to claim 1, wherein the modulator means consists of a monomode light waveguide modulator.

22. In a device according to claim 1, wheren the modulator means consists of a multimode modulator.

23. In a device according to claim 22, wheren the multimode modulator is a Bragg modulator.

* * * * *